(12) United States Patent
Blednov

(10) Patent No.: US 7,939,864 B1
(45) Date of Patent: May 10, 2011

(54) INDUCTIVE BOND-WIRE CIRCUIT

(75) Inventor: Igor Blednov, Nijmegen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 12/791,575

(22) Filed: Jun. 1, 2010

(51) Int. Cl.
*H01L 29/76* (2006.01)

(52) U.S. Cl. .. 257/275; 257/277; 257/784; 257/E23.024

(58) Field of Classification Search .................. 257/784, 257/275, 277, E23.024
See application file for complete search history.

(56) References Cited

U.S. PATENT DOCUMENTS

| | | | | |
|---|---|---|---|---|
| 5,973,567 | A * | 10/1999 | Heal et al. ..................... | 330/286 |
| 6,194,774 | B1 * | 2/2001 | Cheon ........................... | 257/531 |
| 6,998,952 | B2 * | 2/2006 | Zhou et al. ..................... | 336/200 |
| 7,084,708 | B2 * | 8/2006 | Sugiura et al. ................. | 330/302 |
| 7,276,420 | B2 * | 10/2007 | Liu et al. ........................ | 438/329 |
| 7,453,142 | B2 * | 11/2008 | Lee et al. ...................... | 257/691 |

* cited by examiner

*Primary Examiner* — Eugene Lee

(57) ABSTRACT

A bond wire circuit includes bond wires arranged relatively to provide a selected inductance. In connection with various example embodiments, respective bond wire loops including forward and return current paths are arranged orthogonally. Each loop includes a forward bond wire connecting an input terminal with an intermediate terminal, and a return bond wire connecting the intermediate terminal to an output terminal. The return bond wires generally mitigate return current flow from the intermediate terminal in an underlying substrate. In some implementations, the loops are arranged such that current flowing in each of the respective loops generates equal and self-cancelling current in the other of the respective loops.

28 Claims, 5 Drawing Sheets

INDUCTIVE BOND-WIRE CIRCUIT

Amplifiers for a variety of applications, including such as for mobile communications base stations, have seen significant growth. For these amplifiers, high power efficiency and small size are desirable, yet have been difficult to achieve as these can be contradictory. In addition, many integrated amplifiers made on semiconductor substrates as well as devices used for such amplifiers exhibit undesirably high radio frequency (RF) losses. For different signals processed using impedance transformation based circuits, problems can result from mutual coupling between the signals.

For example, silicon substrates used for MOS and LDMOS integrated circuits have a relatively thick skin layer of the within the ground plane (e.g., about 120 um for Silicon LDMOS processes) which is caused by characteristics of highly-doped semiconductor material and, depending on the frequency of operation, can exhibit significant RF losses. Losses in the substrate may include one or more of several types of losses, such as ohmic losses and polarization losses. Ohmic losses are often caused by carriers traveling through the substrate, RF return currents flowing through the substrate (e.g., with layer thickness equal to about three times the thickness of the skin layer), and Eddy currents such as those caused by magnetic fields generated by passive and active components located on and above the substrate surface. Depending on the doping level of substrate volume, skin layer thickness and its properties may vary in relatively wide range. Conductive substrates may introduce frequency dependant losses and conductivity, which makes characterization and development of integrated component more difficult. As a result, passive components deposited on such substrates suffer from a low quality factor, which is also frequency dependant. For example, integrated spiral inductances on an LDMOS Si substrate have exhibited relatively low quality factors, which degrade at various frequencies both below and above an (often-used) 2 GHz frequency. These losses and other undesirable characteristics are exacerbated by market demands for the integration of RF power device solutions as a monolithic microwave integrated circuit (MMIC), in which all components are desirably located very close to one other and are susceptible to mutual magnetic coupling.

These and other issues have presented challenges to the implementation of RF circuits, and particularly of amplifier circuits in connection with various substrates.

Various example embodiments are directed to bond wire circuit that address and/or mitigate issues such as those discussed above. Some embodiments mitigate or eliminate a return path for RF current flowing in substrates, such as highly-doped conductive silicon substrates used as a ground plane in an MMIC device.

In connection with another example embodiment, an inductive circuit includes first and second sets of terminals for receiving and outputting current, each set of terminals including an input terminal, an intermediate terminal and an output terminal. The inductive circuit further includes respective sets of bond wires for each set of terminals. Each set of bond wires includes a first bond wire connected between the input terminal and the intermediate terminal, and a second bond wire connected between the intermediate terminal and the output terminal. The first and second bond wires are substantially parallel to one another and respectively configured to pass current received at the input terminal through the intermediate terminal and to the output terminal. The first and second bond wires connected to the first set of terminals is also arranged orthogonally relative to the first and second bond wires connected to the second set of terminals.

Another example embodiment is directed to a radio frequency amplifier circuit including a laterally diffused metal oxide semiconductor (LDMOS) substrate, a main amplifier circuit, a peak amplifier circuit, and a pair of inductive loop circuits. Each inductive loop circuit includes an input terminal for receiving current, an output terminal for outputting current, an intermediate terminal and a pair of parallel bond wires. The output terminals are respectively coupled to one of the main and peak amplifier circuits. The pair of parallel bond wires extend over the substrate, with a first one of the bond wires being connected between the input terminal and the intermediate terminal, and a second one of the bond wires being connected between the intermediate terminal and the output terminal. The bond wires are respectively configured to pass current received at the input terminal through the intermediate terminal and to the output terminal. In addition, the parallel bond wires in one of the pair of inductive loops are orthogonally oriented relative to the parallel bond wires in the other one of the pair of inductive loops.

According to another example embodiment, an amplifier circuit includes an LDMOS substrate; an RF signal input circuit, a receiver circuit, an output circuit, a source bond wire and a return bond wire. The input circuit is located between an end of the source bond wire and the substrate (as a ground/reference plane), and receives an RF signal. The receiver circuit is also in or on the substrate and is coupled to receive the RF signal from the input circuit via the source bond wire, and to return the current to the output circuit. The source bond wire circuit is located over the substrate and connected to both the input circuit and the receiver circuit for passing the received RF signal from the input circuit to the receiver circuit. The return bond wire circuit is located over the substrate and is connected to both the receiver circuit and the output circuit, for passing a return RF signal from the receiver circuit to the output circuit.

In connection with another example embodiment, an amplifier circuit (e.g., a Doherty amplifier circuit) includes a laterally diffused metal oxide semiconductor (LDMOS) substrate, inductive loop circuits, a main amplifier and a peak amplifier. Each inductive loop circuit includes an input terminal for receiving current, an output terminal for outputting current, an intermediate terminal, and a parallel bond wires extending over the substrate. A first one of the bond wires is connected between the input terminal and the intermediate terminal, and a second one of the bond wires is connected between the intermediate terminal and the output terminal. The bond wires are respectively configured to pass current received at the input terminal through the intermediate terminal and to the output terminal. In addition, the bond wires in one of the inductive loop circuits are orthogonally oriented relative to the bond wires in another one of the inductive loop circuits. The main amplifier is coupled to an input terminal of a first one of the loop circuits, and the peak amplifier is coupled to an output terminal of the first one of the loop circuits to which the main amplifier is connected.

Another example embodiment is directed to a radio frequency amplifier circuit including an LDMOS substrate, a main amplifier and a peak amplifier. An input terminal on the substrate is coupled to an input of the main amplifier via a capacitor and further configured to receive an input RF signal. An input bond wire circuit includes at least two substantially parallel bond wires extending over the substrate, a first one of the bond wires being coupled to the input terminal, and another one of the bond wires being coupled to an input of the peak amplifier. The respective bond wires being configured to couple the input RF signal to the peak amplifier. Main and peak capacitive circuits respectively include a capacitor coupled to the input of the main and peak amplifiers, each by an inductive circuit having at least two substantially parallel bond wires extending over the substrate in a substantially orthogonal arrangement, relative to the bond wires of the input bond wire circuit.

The above discussion/summary is not intended to describe each embodiment or every implementation of the present disclosure. The figures and detailed description that follow also exemplify various embodiments.

Various example embodiments may be more completely understood in consideration of the following detailed description in connection with the accompanying drawings, in which.

Figure 1:
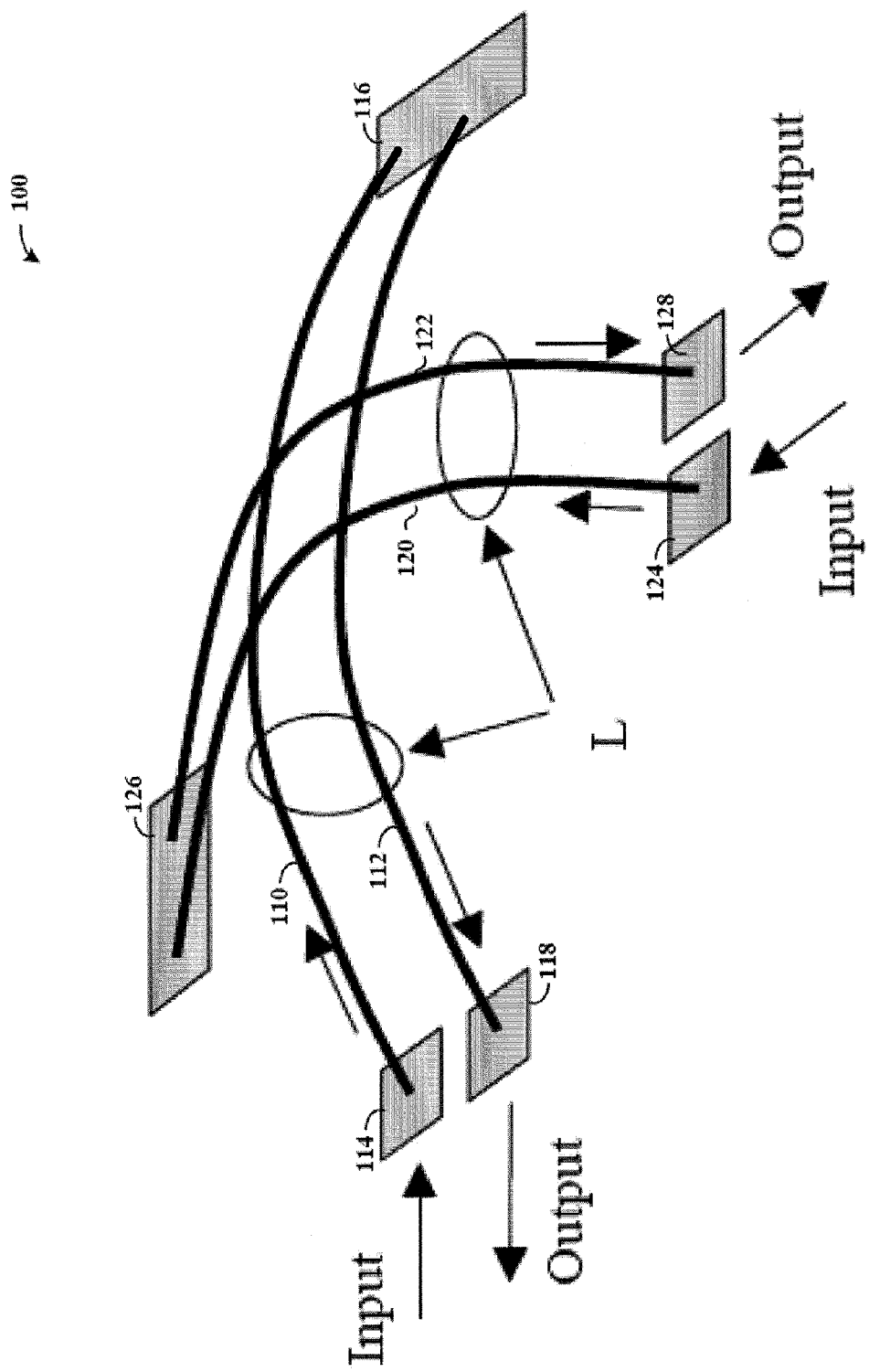
FIG. 1 shows a bond wire arrangement, in accordance with an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention including aspects defined in the claims.

The present invention is believed to be applicable to a variety of different types of processes, devices and arrangements for use with various circuits, including inductive circuits for amplifiers, as well as various applications of these circuits such as those involving wireless communications and radio frequency (RF)/microwave signals. While the present invention is not necessarily so limited, various aspects of the invention may be appreciated through a discussion of examples using this context.

According to an example embodiment of the present invention, a bond wire circuit includes sets of (about or near) parallel forward and return bond wires, with each set being (about or near) orthogonal to one another. The first bond wire in each set receives current at an input terminal at an end of the bond wire and passes the current to an intermediate terminal at the other end of the bond wire. The second bond wire in each set is coupled to the intermediate terminal for that set, and passes the current at the intermediate terminal to an output terminal for that set.

In many implementations, the parallel bond wire sets have equal but opposite currents and generate limited (or no) return current in an underlying substrate, to mitigate RF losses and undesirable magnetic coupling. The orthogonal orientation accordingly mitigates mutual magnetic coupling through via air. The cancellation effect of current induced in a wire in one of the sets, by a wire or wires in another of the sets (via opposite current of a same amplitude), also mitigates undesirable coupling.

For each of the sets of bond wires, current received at the input terminal is coupled to the output terminal, via parallel bond wires and an intermediate terminal. The current passed through each set of the bond wires is thus passed orthogonally, relative to current passed through the other set of bond wires. As the bond wires may be arranged with some sort of curvature or other non-linear or non-planar configuration, the term orthogonal as used here may relate, for example, to the passage of current in or near planes that are arranged orthogonally relative to one another.

These orthogonal arrangements can be used, for example, to mitigate mutual coupling between the orthogonal bond wires to a level that is below about −70 dB, and can achieve this using a variety of substrates such as LDMOS substrates. In addition, current induced by current flowing in the other set of bond wires can be controlled as equal and generally self-eliminating currents, via the positioning of the orthogonal wires (e.g., as applicable to current flowing in the sets of bond wires and/or in an underlying substrate).

In some embodiments, a bond wire circuit as discussed above is configured to operate to mitigate RF losses and magnetic coupling under other excitation schemes. For example, the respective terminals can be coupled for differential excitation, such as via connection of a signal source between two bond wires of a common wire set, or through common ground plane. As another example, the signal source can be connected between a common ground plane (e.g., Silicon substrate such as Si LDMOS) and one of bond wires of a given wire set.

In accordance with various embodiments, the input and output terminals are arranged nearly immediately adjacent to one another, such that the input and output current is provided via terminals that are spatially close to one another. For instance, each of the respective sets of parallel bond wires as described above can be respectively coupled to input/output terminals that are next to one another, with the respective sets of input/output terminals for each set of bond wires being located at about a 90-degree rotation relative to the other set of input/output terminals and the bond wires connected thereto (to effect a near-orthogonal orientation of the bond wires).

In certain implementations, the input and output terminals are electrically isolated from one another using an insulator and/or by nature of their placement upon an underlying substrate. For instance, where the terminals are formed in or on a surface layer of a semiconductor substrate, the terminals may be electrically isolated from one another to mitigate or prevent current flow through the substrate. This isolation may be achieved, for example, using an insulating material between the terminals and the substrate surface, or insulating material in the surface such as material used with shallow-trench isolation (STI).

The position of the input/output terminals is varied to suit certain applications, in connection with various implementations. For instance, the input/output terminals may be moved relative to one another in a direction that is orthogonal to and/or parallel to the bond wires, while maintaining the bond wires connected to the terminals relatively parallel to one another. This approach may be applicable, for example, to the arrangements as shown in the figures, discussed in the following.

In connection with many embodiments, the parallel arrangement of the bond wires in each set, and the orthogonal arrangement of the respective sets of parallel bond wires, is set to mitigate losses associated with returning current using underlying substrate, relative to bond wires. Accordingly, the return bond wires are configured to mitigate the spread of current that may occur with current returning from an intermediate terminal to an output terminal through the underlying substrate, by offering a low-resistance path via which the current may return. In many implementations, the bond wires are beneficially used over lossy substrates, such as laterally-diffused metal oxide semiconductor (LDMOS) Silicon substrates that are particularly disadvantageous for conducting the returning current. The bond wires facilitate a desirable quality factor of inductance (e.g., Q>20), when compared to equivalent commonly used integrated spiral inductance exhibiting Q<7 as best around 2 GHz. Quality factors Q for bond-wires arranged over such a substrate at certain conditions can be set up to about 100 at above 7 GHz, with very low and frequency independent losses.

According to a more particular example embodiment, a bond wire circuit as discussed herein is interconnected as an inductive input compensation circuit of a high-power amplifier. The inductive circuit includes respective sets of parallel bond wires as discussed above, having their respective outputs coupled to provide received signals to the inputs of different amplifier circuits, such as main and peak amplifiers. The orthogonal orientation of the bond wires facilitates the isolation of the respective signals as provided, under conditions that exhibit low power loss and low/mitigated mutual coupling.

In another more particular example embodiment, a mobile communications base station amplifier circuit includes a bond wire circuit as discussed herein. The circuit with bond wire is used to amplify signals used for wireless radio frequency (RF) communications with mobile hand-held devices such as mobile phones or other media devices.

In connection with various embodiments, the term orthogonal is used to refer to the orientation of bond wires or sets of bond wires. This term may be applicable, for example, to bond wires that extend in planes that are at or near perpendicular to one another (e.g., within several degrees of being perpendicular). The term parallel is also used to refer to orientation in connection with various embodiments, including the orientation of bond wires in a loop. This term and/or the term substantially parallel may be applicable to bond wires extending in parallel planes, or in planes that are near parallel (e.g., within several degrees of parallel).

Turning now to the figures, FIG. 1 shows a bond wire arrangement 100, in accordance with an example embodiment of the present invention. The bond wire arrangement 100 includes two orthogonally-oriented inductive loops made of four bond wires. Forward and return current-carrying (i.e., RF signal) bond wires 110 and 112 respectively extend between an input terminal 114 and an intermediate terminal 116, and between the intermediate terminal and an output terminal 118. Forward and return current-carrying bond wires 120 and 122 respectively extend between an input terminal 124 and an intermediate terminal 126, and between the intermediate terminal and an output terminal 128. When a signal is applied between terminal 124 and terminal 128, the return current path in an underlying reference plane/highly doped substrate volume becomes the shortest one or practically eliminated, mitigating (e.g., allowing minimal) current spread in an underlying ground plane and coupling with return currents inside the ground plane, such as may be generated by other MMIC components located on the substrate.

RF current of the same magnitude flowing in the parallel wires (110/112 and 120/122) generates minimal return current in the ground plane below the respective terminals. More specifically, return current flowing form the intermediate terminals back to the input/output terminals for each respective loop is mitigated or nearly eliminated via the arrangement of the respective bond wires as shown. For instance, where the terminals are formed on or in a substrate such as an LDMOS substrate, the bond wires carry all or nearly all return current from the respective intermediate nodes (e.g., terminals) back to the output nodes for each loop.

The orthogonal orientation of the loops facilitates the generation of equal and self-eliminating currents in each loop, by the one of the loops. More specifically, inductive current generated in bond wires 110/112 by current passing in bond wires 120/122 is equal to inductive current generated in bond wires 120/122 by current passing in bond wires 110/112 (e.g., using a common or similar input current).

The proximity of the input and output terminals 114 and 118, and of the input and output terminals 124 and 128, can be set to mitigate or eliminate any return current in underlying substrate areas between the input and output terminals. The respective input and output terminals are effectively or nearly isolated from one another. For certain implementations, circuit components and connections to each of the respective loops relative to a ground are configured to set the impedance for each loop to about equal, to electrically isolate the terminals.

Figure 2:
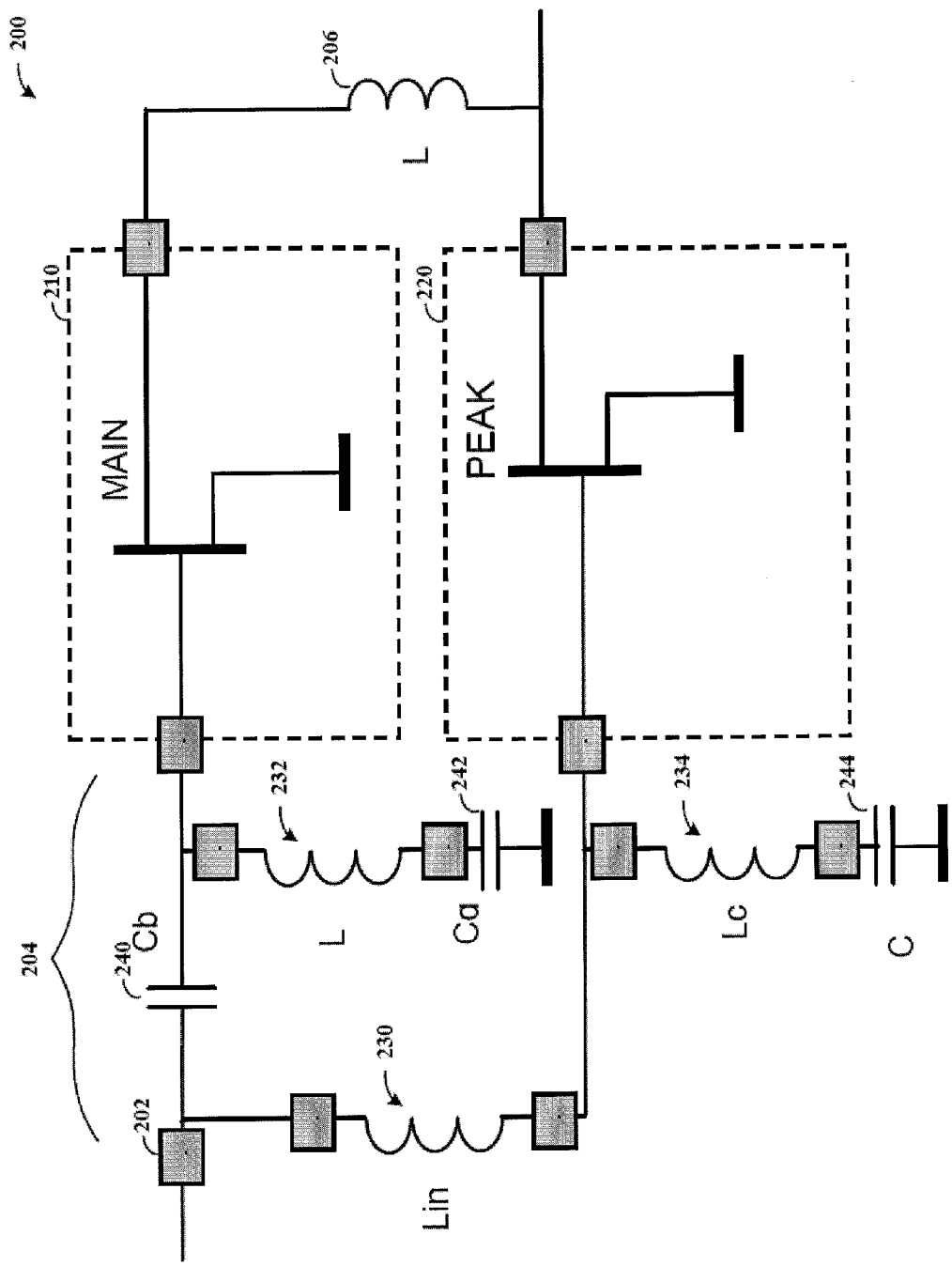
FIG. 2 shows a circuit diagram for an integrated power amplifier circuit, according to another example embodiment of the present invention.

FIG. 2 shows a diagram of a semiconductor-based amplifier circuit 200 having an input inductive compensation bond wire arrangement, according to another example embodiment of the present invention. The amplifier circuit 200 includes main and peak amplifiers 210 and 220, supplied with RF signals from an RF signal received at an input 202 and passed through a compensation-input circuit 204. The main and peak amplifiers are further coupled at their outputs by an inductive circuit 206.

The input compensation circuit 204 includes orthogonally-oriented inductive loops, with respective inductances represented by inductive circuits 230, 232 and 234, having forward and return bond wires (such as shown in FIG. 1), with respective input, output and intermediate terminals. The respective inductive loops are arranged over a ground-plane substrate that facilitates desirable mutual coupling between the parallel bond wires, which is below about −70 dB in some instances. The input compensation circuit 204 also includes three capacitive circuits 240, 242 and 244, the first coupled between the input 202 and the main amplifier, and the latter respectively coupling inductive circuits 323 and 234 to the ground plane.

Figure 3:
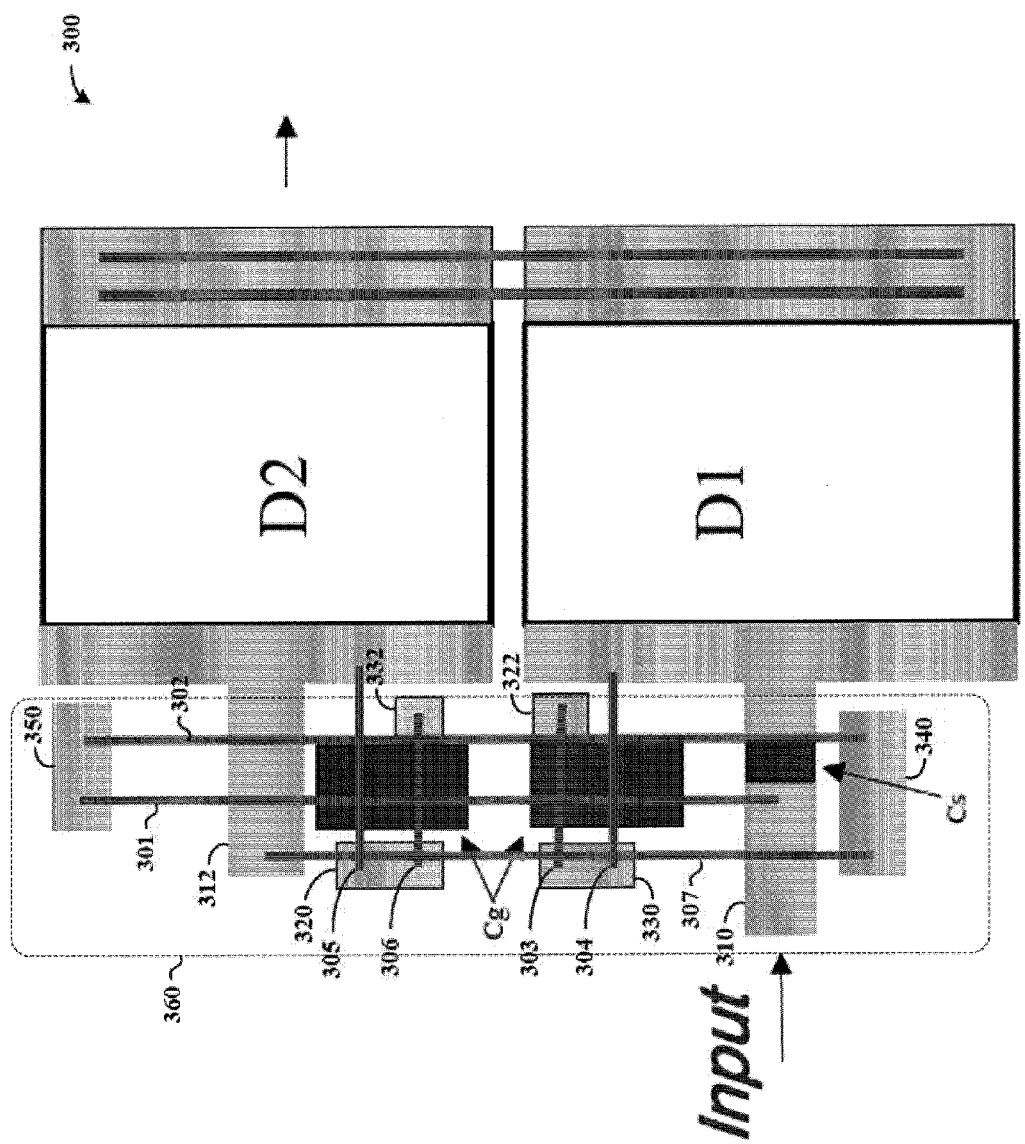
FIG. 3 shows an example of an integrated power amplifier circuit, according to another example embodiment of the present invention.

FIG. 3 shows an integrated LDMOS power amplifier circuit 300, according to another example embodiment of the present invention. The power amplifier circuit 300 may be implemented in accordance with the diagram shown in FIG. 2. The circuit 300 includes an orthogonal bond wire arrangement having separate inductive loops, such as shown in FIG. 1 and discussed above. The respective loops feed main and peak amplifier circuits D1 and D2. Input current at input terminal 310 of amplifier D1 is passed through bond wire 301 to intermediate terminal 350, through bond wire 302 to intermediate terminal 340, and through bond wire 307 to terminal 312 (e.g., gate) of amplifier D2. The bond wires 301, 302 and 307 are arranged generally orthogonally to two parallel compensation bond wire sets 303/304 and 305/306, respectively connected to the inputs of amplifiers D1 and D2. The bond wire sets 303/304 and 305/306 respectively pass passing current from the amplifier inputs to intermediate terminals 320 and 330, and to output/end terminals 322 and 324, which are coupled to grounding capacitors (Cg). A capacitor (Cs) is also located in the input path of input terminal 310 to the main amplifier D1.

In some embodiments, a metal-based shield layer 360 is formed over a substrate, such as an LDMOS substrate, underlying the bond wires and separated from the substrate by an insulating layer (e.g., a dielectric material). The shield layer 260 is coupled to a ground plane and/or highly doped substrate area, as may be near input and output bondpads to which the bondwires are connected. The shield layer can thus be connected to a reference ground plane having a highly-doped lossy conductive substrate layer, which is directly connected to a package of a device in which the circuit is used (e.g., connected by solder to metal flange of a power device package). Due to the loop-like shape of the bondwires, return currents generated in highly doped substrate by each wire compensate for one other. Such an arrangement can be used to achieve a quality factor (Q-factor) at 2 GHz of about 10 times higher than of an integrated inductance.

Figure 4:
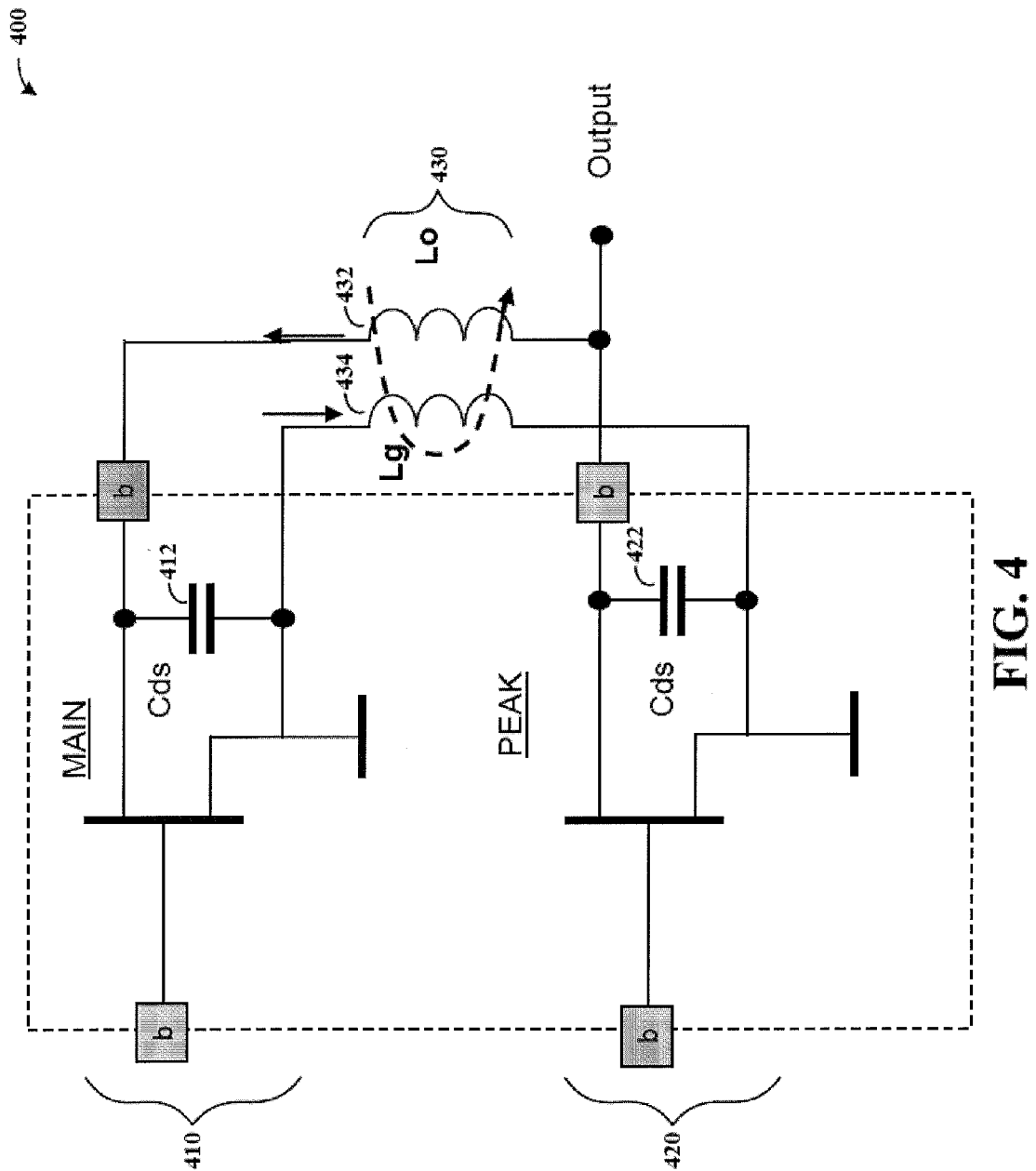
FIG. 4 is a circuit diagram for an amplifier, according to another example embodiment of the present invention.

FIG. 4 is a circuit diagram for an amplifier device 400, according to another example embodiment of the present invention. The device 400 includes main and peak amplifiers 410 and 420, and an output circuit 430 that mitigates a need for return current from the amplifiers through bond wires, and mitigate return current flow in an underlying substrate. The output circuit 430 includes two bond wire sets 432 and 434, represented by inductances Lo and Lg, arranged in parallel to each other. The bond wire set 432 connects the drain terminals of the amplifiers 410 and 420, allowing forward current to flow. Wire set 434 connects source terminals of the amplifiers 410 and 420. Each of the source/drain terminals for the amplifiers is separated by capacitive circuits 412 and 422.

Figure 5:
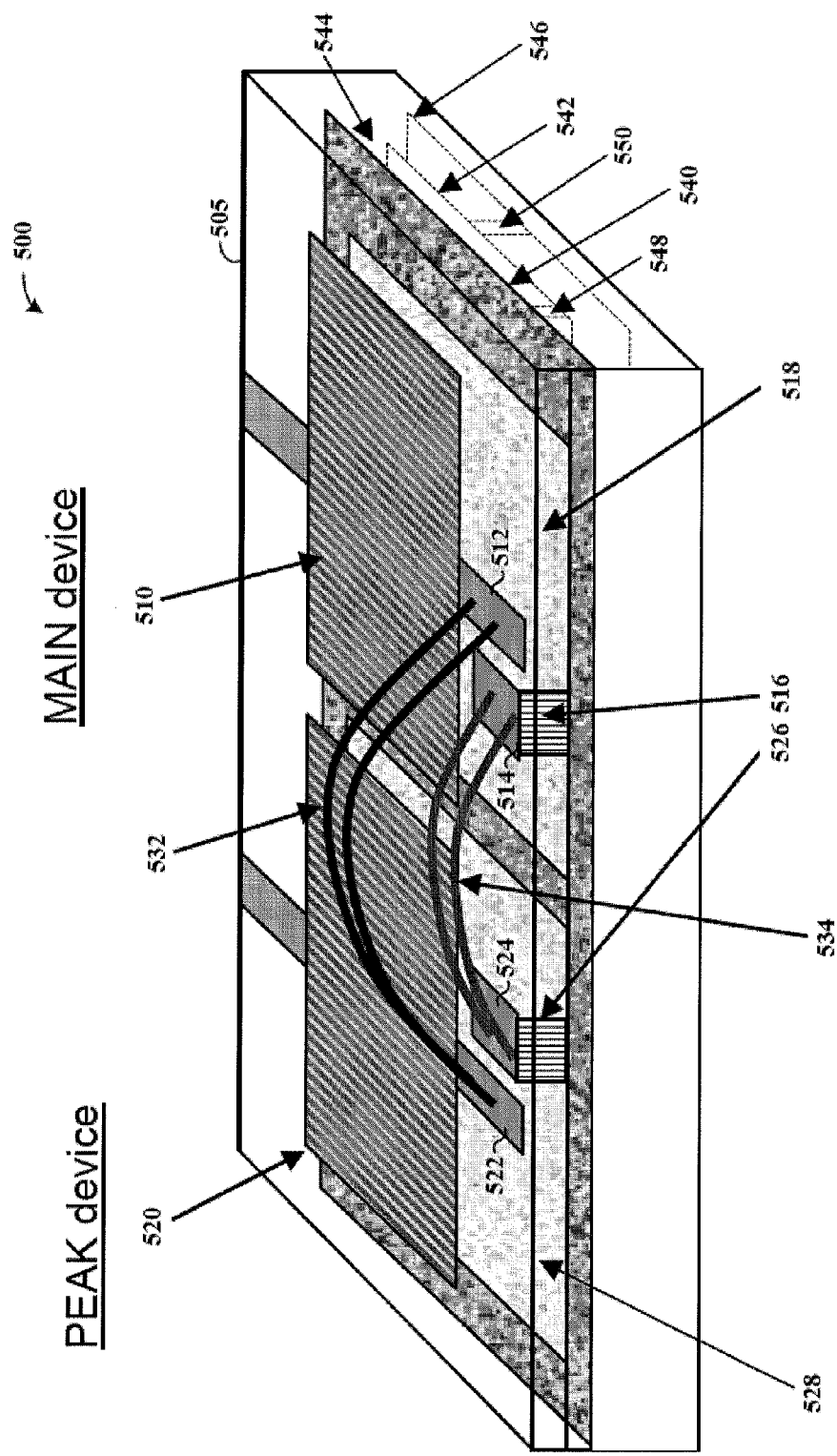
FIG. 5 shows an output bond wire circuit arrangement, according to another example embodiment of the present invention.

The bond wire sets 430 and 434 can be connected to the terminals of the amplifiers 410 and 420 (LDMOS devices) via bond pads on the surface of an underlying substrate, coupled to metal (or a shielding/plate structure) of the amplifiers. One such approach is shown in FIG. 5 and described below. Return current of both amplifiers is forced to flow through bond wires, instead of through the underlying substrate (e.g., when implemented with a highly-doped Silicon substrate such as Si LDMOS). Losses and mutual coupling of these return currents, to return currents of other components of amplifiers, are accordingly mitigated or even eliminated.

FIG. 5 shows output bond wire circuit arrangement 500, according to another example embodiment of the present invention. The circuit arrangement 500 may, as discussed above, be implemented using an approach as shown in and described in connection with FIG. 4, such as may be applicable for use as a MMIC power amplifier.

Main and peak amplifier circuits 510 and 520 are formed on a substrate 505, such as a highly-doped or other substrate via which return currents are undesirable. Output terminal 512 of amplifier circuit 510 is coupled to terminal 522 by bond wire circuit 532. Bond pads 514 and 524 are coupled to one another by bond wire circuit 534, and respectively coupled by connectors 516 and 526 to source terminals 518 and 528 of each amplifier. This approach can be used to isolate respective inductance loops, such as to improve isolation of a power amplifier output network, from a lossy Silicon substrate and other components, facilitating output power efficiency and stability both in and outside of an operational frequency band.

In many applications, the circuit arrangement 500 includes one or more conductive layers underlying the circuits as shown. For instance, layer 540 includes a conductive layer having one or more of a magnetically-neutral metal and a magnetic metal, which may be further connected to a ground plane (e.g., within the device 500). Where multiple layers or strips of metal layers are included (e.g., layer 542, 546), the layers may be separated by a dielectric material (e.g., 544) to electrically insulate the layers/strips from one another. In some implementations involving multiple metal shielding layers, the respective layers are separated by dielectric material and further electrically connected by connectors coupling the layers (e.g., via 548) and/or connected to a reference ground plane, source metal layers 518, 528 (e.g., by via 550) and to the highly doped conductive volume of substrate, in such a way that interconnections (e.g., 548, 550) connect multiple metal shielding layers (e.g., 518, 528, 540, 542, 546) to a highly doped conductive volume of substrate beneath the main input and main output terminals (or input and output bond wire pads) of the semiconductor die of the circuit arrangement 500.

Based upon the above discussion and illustrations, those skilled in the art will readily recognize that various modifications and changes may be made to the present invention without strictly following the exemplary embodiments and applications illustrated and described herein. For example, the bond wires as shown and discussed may be replaced with bond wires of different size, thickness or shape. The orientation of the bond wires relative to one another can be modified while mitigating signal loss (e.g., at less or more than orthogonal angles, at different heights or different spacing). The loop circuits as discussed herein may also be implemented in connection with a multitude of disparate devices, including those having amplifiers, radio-frequency circuits and others. Such modifications do not depart from the true spirit and scope of the present invention, including that set forth in the following claims.

What is claimed is:

1. An inductive circuit comprising:
   first and second sets of terminals for receiving and outputting current, each set of terminals including an input terminal, an intermediate terminal and an output terminal; and
   for each set of terminals, respective sets of bond wires including
   a first bond wire connected between the input terminal and the intermediate terminal, and
   a second bond wire connected between the intermediate terminal and the output terminal,
   the first and second bond wires being substantially parallel to one another and respectively configured to pass current received at the input terminal through the intermediate terminal and to the output terminal, and
   the first and second bond wires connected to the first set of terminals being arranged orthogonally relative to the first and second bond wires connected to the second set of terminals.

2. The circuit of claim 1, further including:
   a laterally diffused metal oxide semiconductor (LDMOS) substrate, and
   first and second amplifiers respectively coupled to input and output terminals of one of the sets of terminals.

3. The circuit of claim 1,
   further including a laterally diffused metal oxide semiconductor (LDMOS) substrate, and
   wherein the orthogonally-oriented bond wires are arranged to generate equal and self-eliminating currents in each other, and to pass current received at the intermediate terminals to the output terminal to mitigate the passage of return current from the intermediate terminal to the output terminal via the LDMOS substrate.

4. The circuit of claim 1,
   further including a laterally diffused metal oxide semiconductor (LDMOS) substrate, and
   wherein the orthogonally-oriented bond wires are arranged to generate equal and self-eliminating currents in each other in response to RF current of the same magnitude flowing in the bond wires, and to pass current received at the input terminal via the bond wires to mitigate the passage of return current in the LDMOS substrate.

5. The circuit of claim 1, further including:
an LDMOS substrate on which the input and output terminals are located, separated by layer of insulative material deposited on the substrate and arranged to electrically insulate the input terminals from the output terminals.

6. The circuit of claim 1, further including:
a substrate in which at least a portion of the input and output terminals are located, and
insulative material in a portion of the substrate between the input and output terminals and configured to electrically insulate the input terminals from the output terminals.

7. The circuit of claim 1,
wherein the intermediate terminal of the first set of terminals includes separate intermediate sub-terminals connected by an intermediate bond wire that is substantially parallel to the first and second bond wires of the first set of terminals, the first bond wire being connected to a first one of the sub-terminals and the second bond wire being connected to a second one of the sub-terminals, and
further including a third set of terminals with respective sets of bond wires, the second and third set of terminals being substantially parallel to one another, the respective bond wires being arranged in length and orientation to mitigate magnetic coupling between sets of bond wires.

8. The circuit of claim 1, further including:
first and second amplifiers respectively coupled to input and output terminals of one of the sets of terminals, and
an output circuit coupled to the amplifiers, the output circuit including at least two bond wires that are substantially parallel to one another and respectively coupling the amplifiers with one another.

9. The circuit of claim 1, further including:
first and second amplifiers respectively coupled to input and output terminals of one of the sets of terminals, each amplifier having source and drain terminals, and
an output circuit coupled to the amplifiers, the output circuit including at least two bond wires that are substantially parallel to one another and that extend over an underlying substrate, a first one of the output circuit bond wires coupling the source terminals of the amplifiers to one another, and a second one of the output circuit bond wires coupling the drain terminals of the amplifiers to one another.

10. The circuit of claim 1, further including:
first and second amplifiers respectively coupled to input and output terminals of one of the sets of terminals, each amplifier having source and drain terminals, and
an output circuit coupled to the amplifiers, the output circuit including two sets of bond wires that are substantially parallel to one another and that extend over an underlying substrate, a first one of the sets of output circuit bond wires coupling the source terminals of the amplifiers to one another, and a second one of the sets of output circuit bond wires coupling the drain terminals of the amplifiers to one another.

11. The circuit of claim 1, further including
first and second amplifiers respectively coupled to input and output terminals of one of the sets of terminals, the first amplifier being coupled to the input terminal via a capacitor, and
capacitive circuits coupled between the inputs of each amplifier and a ground plane of an underlying substrate.

12. The circuit of claim 1, further including
a doped substrate over which the bond wires extend, and
on the doped substrate, a conductive layer including a magnetically-neutral metal, separated from doped substrate by layer of insulating material and connected to the ground plane.

13. The circuit of claim 1, further including
a doped substrate over which the bond wires extend, and
on the doped substrate, a conductive layer including a magnetic metal connected to a ground plane.

14. The circuit of claim 1, further including
a doped substrate over which the bond wires extend, and
on the doped substrate, a plurality of magnetically-neutral conductive layers separated by dielectric material connected to the ground plane.

15. The circuit of claim 1, further including
a doped substrate over which the bond wires extend, and
on the doped substrate, a plurality of conductive layers separated by dielectric material, the conductive layers being electrically isolated from one another.

16. The circuit of claim 1, further including
a doped substrate over which the bond wires extend, and
on the doped substrate, a plurality of conductive layers separated by dielectric material, at least some of the conductive layers being electrically connected to each other and to the ground plane.

17. The circuit of claim 1, further including
a doped substrate over which the bond wires extend, and
on the doped substrate, a plurality of conductive layers separated by dielectric material, at least some of the conductive layers being electrically connected to at least one of: a reference ground plane and a highly doped volume of substrate serving as reference ground plane, at main input and main output terminals of a MMIC amplifier to which the inductive circuit couples a signal received at the input terminals of the first and second sets of terminals.

18. An amplifier circuit comprising:
a laterally diffused metal oxide semiconductor (LDMOS) substrate;
inductive loop circuits, each inductive loop circuit including
an input terminal for receiving current,
an output terminal for outputting current,
an intermediate terminal, and
a parallel bond wires extending over the substrate, a first one of the bond wires being connected between the input terminal and the intermediate terminal, a second one of the bond wires being connected between the intermediate terminal and the output terminal, the bond wires being respectively configured to pass current received at the input terminal through the intermediate terminal and to the output terminal,
the bond wires in one of the inductive loop circuits being orthogonally oriented relative to the bond wires in another one of the inductive loop circuits;
a main amplifier circuit coupled to an input terminal of a first one of the loop circuits; and
a peak amplifier circuit coupled to an output terminal of the first one of the loop circuits to which the main amplifier is connected.

19. The circuit of claim 18, wherein
the inductive loop circuits include three inductive loop circuits, and
the input terminal of a second one of the loop circuits is coupled to an input of the main amplifier, and the input terminal of a third one of the loop circuits is coupled to an input of the peak amplifier.

20. The circuit of claim 18, further including an output circuit coupled to the amplifiers, the output circuit including at least two bond wires that are substantially parallel to one another and respectively coupling the amplifiers with one another.

21. The circuit of claim 18,
wherein the main and peak amplifiers respectively have source and drain terminals, and
further including an output circuit including at least two bond wires that are substantially parallel to one another, a first one of the output circuit bond wires coupling the source terminals of the main and peak amplifiers to one another, and a second one of the output circuit bond wires coupling the drain terminals of the main and peak amplifiers to one another.

22. The circuit of claim 18, wherein the orthogonally-oriented bond wires are arranged to generate equal and self-eliminating currents in each other.

23. The circuit of claim 18, wherein the orthogonally-oriented bond wires are arranged to generate equal and self-eliminating currents in each other in response to RF current of the same magnitude flowing in the bond wires, and to pass substantially all current received at the input terminal via the bond wires to mitigate the passage of return current in the LDMOS substrate.

24. A radio frequency amplifier circuit comprising:
an LDMOS substrate;
a main amplifier;
a peak amplifier;
an input terminal on the substrate and configured to receive an input RF signal, the input terminal being coupled to an input of the main amplifier via a capacitor;
an input bond wire circuit including at least two substantially parallel bond wires extending over the substrate, a first one of the bond wires being coupled to the input terminal, and another one of the bond wires being coupled to an input of the peak amplifier, the bond wires being configured to couple the input RF signal to the peak amplifier;
a main capacitive circuit including a capacitor coupled to the input of the main amplifier by an inductive circuit having at least two substantially parallel bond wires extending over the substrate in a substantially orthogonal arrangement, relative to the bond wires of the input bond wire circuit; and
a peak capacitive circuit including a capacitor coupled to the input of the peak amplifier by an inductive circuit having at least two substantially parallel bond wires extending over the substrate in a substantially orthogonal arrangement, relative to the bond wires of the input bond wire circuit.

25. The circuit of claim 24, further including an output circuit coupled to the outputs of the main and peak amplifiers, the output circuit including at least one bond wire coupling source terminals of the main and peak amplifiers to one another, and at least one bond wire coupling drain terminals of the main and peak amplifiers to one another.

26. The circuit of claim 24, wherein the orthogonally-oriented bond wires are arranged to generate equal and self-eliminating currents in each other, and to mitigate the passage of return current from terminals via the LDMOS substrate.

27. The circuit of claim 24, further including an output circuit coupled to the outputs of the main and peak amplifiers, the output circuit including at least two bond wire coupling the source terminals of the main and peak amplifiers to one another, and at least one bond wire coupling drain terminals of the main and peak amplifiers to one another, the bond wires coupling the source and drain terminals being coplanar.

28. The circuit of claim 24,
wherein the input bond wire circuit connects a gate of the main amplifier with a gate of the peak amplifier,
further including an output circuit coupled to the outputs of the main and peak amplifiers, the output circuit including at least two bond wires coupling the source terminals of the main and peak amplifiers to one another, and at least one bond wire coupling drain terminals of the main and peak amplifiers to one another, and
further including a conducting metal layer arranged beneath the bond wires connecting the source terminals and drain terminals and connecting the source terminals to at least one of a ground plane an highly doped volume of substrate in the amplifier circuit.

* * * * *